(12) United States Patent
Matthias et al.

(10) Patent No.: US 8,415,924 B2
(45) Date of Patent: Apr. 9, 2013

(54) RECHARGEABLE BATTERY CHARGING CASE

(75) Inventors: Wolf Matthias, Stuttgart (DE); Juergen Mack, Goeppingen (DE); Florian Schmehl, Renchen-Ulm (DE); Alexander Osswald, Stuttgart (DE); Rainer Glauning, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 320 days.

(21) Appl. No.: 12/833,369

(22) Filed: Jul. 9, 2010

(65) Prior Publication Data

US 2011/0006729 A1    Jan. 13, 2011

(30) Foreign Application Priority Data

Jul. 9, 2009 (DE) .......................... 10 2009 027 571

(51) Int. Cl.
*H01M 10/46* (2006.01)

(52) U.S. Cl. ....................................................... 320/114

(58) Field of Classification Search .................. 320/107, 320/108, 111, 112, 114, 115; D13/103, 107
See application file for complete search history.

(56) References Cited

U.S. PATENT DOCUMENTS

| 2004/0085043 | A1* | 5/2004 | Germagian et al. | 320/107 |
| 2006/0170395 | A1* | 8/2006 | Yoshimizu et al. | 320/114 |
| 2008/0035507 | A1 | 2/2008 | Collister et al. | |
| 2012/0025766 | A1* | 2/2012 | Reade et al. | 320/110 |

FOREIGN PATENT DOCUMENTS

| GB | 2407718 A | 5/2005 |
| JP | 2007215320 A | 8/2007 |
| WO | 2008041206 A1 | 4/2008 |

* cited by examiner

*Primary Examiner* — Edward Tso
(74) *Attorney, Agent, or Firm* — Kenyon & Kenyon LLP

(57) ABSTRACT

The invention is based on a rechargeable battery charging case, in particular a cordless handheld power tool case, having at least one battery attachment device and a case body. It is proposed that the rechargeable battery charging case has an electrical energy output and a supply unit, which in at least one operating state is connected to the energy output and to the battery attachment device for supplying the energy output.

20 Claims, 1 Drawing Sheet

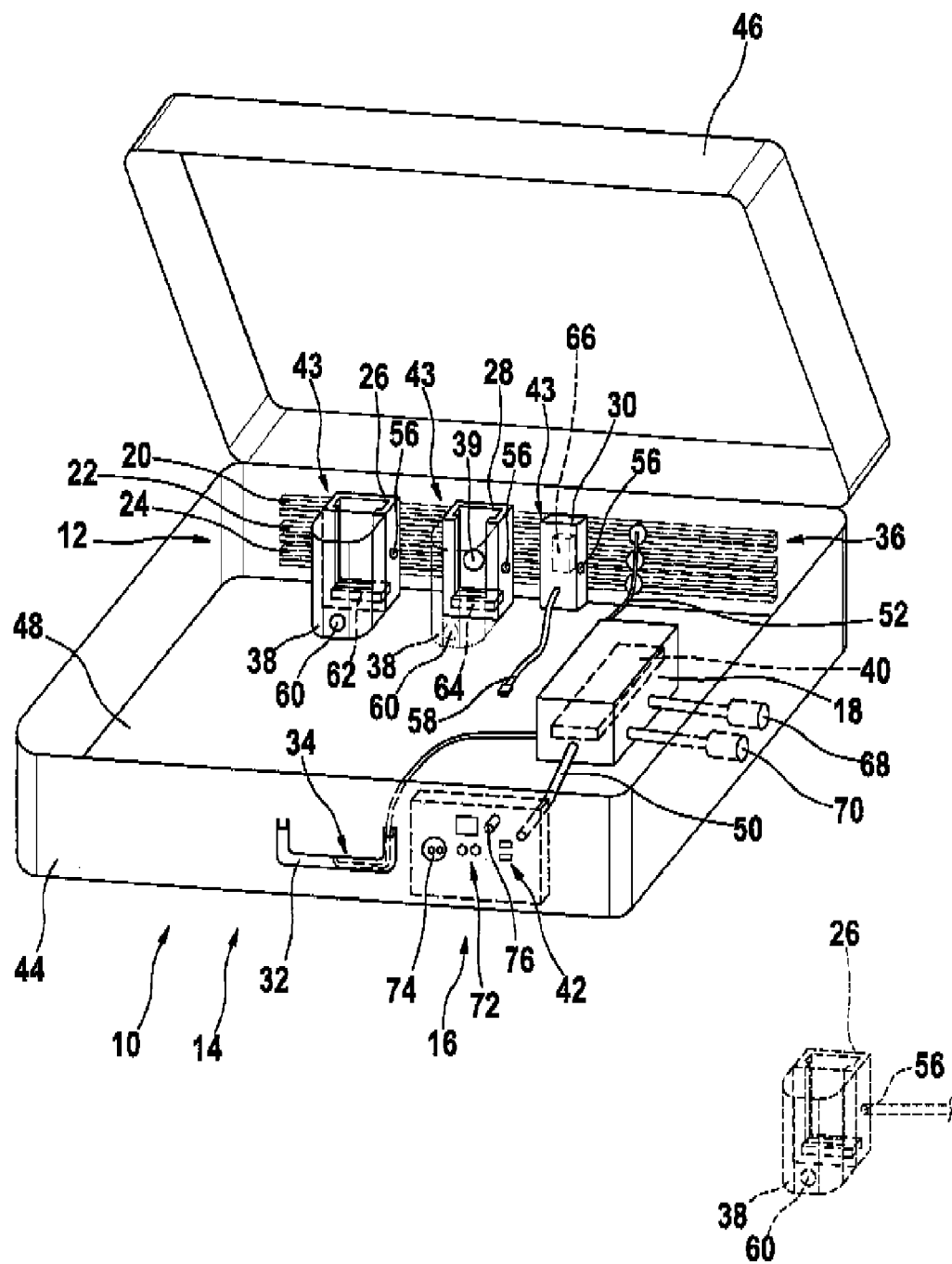

RECHARGEABLE BATTERY CHARGING CASE

CROSS-REFERENCE TO RELATED APPLICATION

This application is based on German Patent Application 10 2009 027 571.1 filed Jul. 9, 2009.

BACKGROUND OF THE INVENTION

1. Field of the Invention

The invention is based on a rechargeable battery charging case, in particular a cordless power tool case, having at least one battery attachment device and a case body.

2. Description of the Prior Art

A rechargeable battery charging case, in particular a cordless handheld power tool case, having at least one battery attachment device and a case body, has already been proposed.

ADVANTAGES AND SUMMARY OF THE INVENTION

It is proposed that the battery charging case has an electrical energy output and a supply unit, which in at least one operating state is connected to the energy output and to the battery attachment device for supplying the energy output. The term "battery attachment device" is intended in particular to mean a device which is intended, in at least one operating state, to exchange electrical energy with at least one battery directly or indirectly. Advantageously, the battery attachment device is intended in particular for at least one battery and/or preferably at least one battery charger to be connected to it, and/or for it to form at least part of a battery charger. Preferably, the battery attachment device is connected mechanically fixedly and/or mechanically disconnectably at least partially with at least one battery and/or with a battery charger. The term "case body" is intended to mean in particular a part of the battery charging case that in a closed state defines a receiving region at least for the battery attachment device of the battery charging case and in particular for a power tool. The term "supply unit" is intended to mean in particular a unit which in at least one operating state makes at least one electrically conductive connection between the energy output and the battery attachment device. Advantageously, the supply unit has at least one cable. In particular, the term "electrical energy output" is intended to mean a device which is intended for conducting electrical energy, which is intended here also to include energy from a magnetic field, out of the case body. Preferably, the electrical energy output is intended for conducting energy onward to a third device. Advantageously, the electrical energy is embodied as a direct or alternating voltage. The term "connected" should be understood in particular to mean coupled electrically and/or mechanically.

By the embodiment according to the invention of the battery charging case, the battery charging case can advantageously be used as a portable electrical energy source, and in particular can supply further devices with energy, in particular in cordless fashion.

The invention is furthermore based on a battery charging case, in particular a cordless power tool case, having at least one battery attachment device and a case body.

It is proposed that the battery attachment device has at least one coupling element, which is provided for connecting at least one battery charger of the battery attachment device disconnectably mechanically and disconnectably electrically to the case body. Advantageously, the coupling element in at least one operating state transmits energy, in particular between the battery charger and the case body. Preferably, the coupling element connects the battery charger and the case body disconnectably and without tools. Especially advantageously, the coupling element includes a detent device, for instance a detent hook fixedly connected to the battery charger and/or a detent strip connected to the case body. The term "battery charger" should be understood in particular to mean a unit which is intended to be connected, advantageously releasably, to a battery, at least for charging the battery. Advantageously, the battery charger is also intended for discharging a battery that is connected to the battery charger. Preferably, a supply unit connects the battery charger of the battery attachment device with an energy output of the case body. Advantageously, the battery charger has at least one element that is intended for monitoring a battery.

By means of this further feature according to the invention, an energy exchange that can be designed flexibly can be achieved. In particular, a battery charger that can be used independently of the battery charging case can be furnished in a structurally simple way.

The invention is furthermore based on a battery charging case, in particular a cordless power tool case, having a case body.

It is proposed that the case body has a suspension device with an energy input and/or an energy output. Advantageously, the suspension device is embodied as a recess, a hook, or some other suspension device that appears appropriate to one skilled in the art, and/or advantageously as a handle. The term "energy input" should be understood to mean in particular a device which is intended for transmitting an electrical and/or magnetic energy from a third device to the battery charging case.

By means of this feature according to the invention of the battery charging case, the battery charging case can be connected especially conveniently, for the purpose of charging a battery, to an energy source or energy reservoir.

In an advantageous feature of the invention, it is provided that the battery charging case has a battery attachment device, as a result of which the battery charging case can exchange energy with a battery, in particular by means of a battery charger, in an especially flexible and structurally simple way.

The invention is furthermore based on a battery charging case, in particular a cordless power tool case, having at least one battery attachment device and a case body, in which it is proposed that the case body has at least one BUS system, which is intended for connecting a plurality of units at least electrically. The term "BUS system" should be understood in particular to mean a connection network having a plurality of BUS nodes, with at least two BUS nodes connected in series and serving to transmit energy and/or preferably data. In particular, the BUS system is provided for connecting at least two BUS nodes parallel by means of an unbranched BUS line unit. The term "BUS node" should be understood in particular to mean a region of the BUS system that is intended for being electrically connected to one of the units. Advantageously, each BUS node has at least two electrical nodes, which are intended for being electrically connected to the unit. Especially advantageously, the two nodes, in at least one operating state, have a different electrical potential. Advantageously, the BUS system is intended for connecting at least one battery, at least one electrical energy consumer, at least one supply unit, at least one battery attachment device, and/or in particular at least one battery charger. Especially advantageously, the BUS system is intended for connecting a plurality of battery chargers. Preferably, the BUS system is intended for transmitting electrical energy, measurement value information, and/or data. Advantageously, the BUS system is connected mechanically fixedly to at least a part of the case body.

By means of the BUS system, units connected to the battery attachment device can be supplied with energy and/or data in a structurally simple way.

It is furthermore proposed that the battery charging case has a battery charger which is intended for charging a battery separately from the case body. The term "separately from the case body" should be understood in particular that the battery charger is intended for being removed from the battery charging case and charging a battery, as a result of which the battery charger can be used and/or sold especially flexibly, even without the battery charging case.

It is furthermore proposed that the battery charging case includes at least one battery charger which has at least one coupling device, which is intended for charging a battery in electrically contactless fashion. Preferably, the coupling device is also intended for discharging a battery, connected to the battery charger, in an electrically contactless fashion. The term "electrically contactless" should be understood in particular to mean without material contact, that is, without an electrically conductive material connection. Advantageously, the device transmits an electrical energy, and advantageously data as well, by means of a capacitive, electromagnetic, and/or advantageously inductive connection. By means of the coupling device, the battery charger can advantageously be connected to the battery in a manner that is not vulnerable to dirt and is protected against short-circuiting.

It is furthermore proposed that the battery charging case has an electronic unit, which is intended for furnishing an adjustable output voltage. Advantageously, the electronic unit makes it possible to adjust a value of the output voltage, a frequency of the output voltage, and/or a value of an output current, advantageously a maximum output current. Especially advantageously, the value of the output voltage, the frequency of the output voltage, and/or the value of the output current is adjustable by a user. By means of the electronic unit, the battery charging case can advantageously be used as a flexible, portable and in particular cordless voltage source and thus can optionally replace an additional voltage source.

It is also proposed that the battery charging case has an electronic unit which is intended for furnishing at least one alternating voltage. Advantageously, the electronic unit furnishes an alternating voltage that meets the IEC standard 60038:1983, has a voltage of 110 V at 60 Hz, and/or corresponds to some other mains voltage that appears appropriate to one skilled in the art. Alternatively and/or in addition, the electronic unit can furnish a direct voltage, such as 5 V, 12 V, and/or 24 V. The term "usual mains voltage" should be understood in particular to mean a voltage of the kind furnished by at least one energy supplier in a power grid. By means of the electronic unit, the battery charging case can advantageously supply energy in cordless fashion to devices operated with an alternating voltage, in particular with a mains voltage.

In addition, it is proposed that the battery charging case has at least one USB interface. Preferably, the USB interface is embodied as an energy output. The term "USB interface" should be understood in particular to mean at least one plug and/or one outlet on a USB standard (Universal Serial Bus). By the USB interface, a large number of different devices with USB interfaces can be supplied with electrical energy in an especially convenient way, in cordless fashion and without an additional power supply unit.

In a further feature, it is proposed that the BUS system has at least two receiving regions for at least one individual, particular unit. Advantageously, in the receiving regions, the unit can be disposed along a graduation or grid in discrete different positions or in continuously variable or transitionless fashion along a course. Preferably, the receiving regions at least partly overlap. The unit is advantageously embodied as a battery charger. By means of the receiving regions, a user can dispose the unit or a plurality of units conveniently, variably, and in a space-saving way, and in particular, different units with different external dimensions can advantageously be disposed.

A system with a battery and a battery charging case is advantageously proposed as well, and the battery is intended to be charged while connected to a power tool by the battery charging case. The term "rechargeable battery" should be understood in particular to mean a unit having at least one accumulator cell. Advantageously, the battery is intended for supplying a motor and/or a measuring sensor of a power tool with energy. The term "handheld power tool" should be understood in particular to mean all power tools that appear appropriate to one skilled in the art, such as power drills, impact drills, saws, planes, screwdrivers, milling cutters, sanders, right-angle sanders, multifunction tools, and/or manual measuring tools and in particular power tools. In particular, the phrase "a battery connected to a power tool" should be understood to mean a battery that is connected in an electrically conductive fashion to a power tool. By means of the system, a battery that is connected to a power tool can be charged conveniently for a user, in particular without the user having to disconnect the battery and the power tool.

BRIEF DESCRIPTION OF THE DRAWING

The invention will be better understood and further advantages thereof will become more apparent from the ensuing detailed description of a preferred embodiment taken in conjunction with the drawing, in which:

FIG. 1 shows a battery charging case of the invention in a perspective view.

DESCRIPTION OF THE PREFERRED EMBODIMENT

FIG. 1 shows a battery charging case 10 of the invention in a perspective view. The battery charging case 10 is embodied as a cordless power tool case and has a battery attachment device 12. The battery charging case 10 furthermore has a case body 14 with a bottom body 44 and a case lid 46. The bottom body 44 and the case lid 46, when the case lid 46 is closed, define a receiving region 48 of the case body 14 for the battery attachment device 12, for rechargeable batteries 38, for battery chargers 26, 28, 30, and for one or more power tools (not shown in detail).

The battery charging case 10 has an electrical energy output 16 and a supply unit 18. The supply unit 18 has an electronic unit 40 and two electrical connecting elements 50, 52. The connecting elements 50, 52 are each embodied as cables. One connecting element 50 connects the supply unit 18, in particular the electronic unit 40 of the supply unit 18, to the energy output 16. The other connecting element 52 connects the supply unit 18 and the electronic unit 40 to the battery attachment device 12. Thus the supply unit 18 connects the energy output 16 and the battery attachment device 12 for supplying the energy output 16 with electrical energy.

The battery charging case 10 has three battery chargers 26, 28, 30. The battery attachment device 12 has three coupling means 20, 22, 24, formed by detent strips. The coupling means 20, 22, 24 connect the battery chargers 26, 28, 30 both mechanically and electrically disconnectably to a BUS system 36 of the case body 14. Thus the supply unit 18 can supply the energy output 16 with electrical energy from a plurality of batteries 38 that, are connected to the battery chargers 26, 28, 30. The battery chargers 26, 28, 30 have detent hooks, not identified by reference numeral, which are intended for being latched in the detent strips or in the coupling means 20, 22, 24. Electric lines of the BUS system 36 are disposed in the coupling means 20, 22, 24.

The BUS system 36 is connected mechanically fixedly to the bottom body 44 of the case body 14 and connects the battery chargers 26, 28, 30 electrically to one another. The BUS system 36 furthermore connects the battery chargers 26, 28, 30 electrically to the supply unit 18, via the connecting element 52. The BUS system 36 has a plurality of receiving regions 43 for the battery chargers 26, 28, 30. The battery chargers 26, 28, 30 can be disposed at arbitrary positions along a course that extends parallel to the coupling means 20, 22, 24.

Alternatively, battery chargers can be partly embodied in one piece with the case body 14; for instance, charging shafts of the battery chargers, not shown in detail, and a region for a charging electronic unit, not shown in detail, of the battery chargers can be extruded together with the case body 14.

The battery chargers 26, 28, 30 each have one energy input 56, by means of which they can be connected directly to a respective energy source, not shown in detail, such as a power supply unit, in order to charge batteries 38 in a region that is separate from the case body 44, and in particular that is outside the receiving region 43. The energy input 56 is embodied as part of a plug connection.

The first battery charger 26 has electrical contacts, not identified by reference numeral. By means of the contacts, the first battery charger 26 is connected electrically directly to the battery 38, in order to charge and discharge the battery 38. The second battery charger 28 has a coupling device 39, which is embodied as a coil. By means of the coupling device 39, the battery charger can, in electrically contactless fashion, charge and discharge a battery 38 and exchange data with the battery 38. The third battery charger 30 has a battery connection cable 58. By means of the battery connection cable 58, the battery charger 30 can charge and discharge a battery (not identified by reference numeral) that is connected to a power tool. To that end, the battery, such as the battery 38 shown, has an, energy input 60, which is contactable when the battery 38 is connected to the power tool.

The battery chargers 26, 28, 30 each have a respective monitoring device 62, 64, 66, which monitor a temperature a charge state of the batteries 38 that are connected to the battery chargers 26, 28, 30. Alternatively, the supply unit 18 could have a monitoring device that monitors all or at least a plurality of the battery chargers connected to the supply unit 18 and the batteries connected to the battery chargers, for instance by means of a multiplexer. In that case, the monitoring device is embodied as partly in one piece with the electronic unit of the supply unit 18, and the BUS system 36 has data and/or measurement lines.

The case body 14 has three energy inputs 34, 68, 70, which are connected to the supply unit 18. The first energy input 68 is embodied as a 12 to 24 Volt direct voltage input and can be supplied with energy from a motor vehicle, not shown. The second energy input 70 is embodied as an alternating voltage input and can be supplied with energy by means of an alternating voltage (110 to 230 V, 50 to 60 Hz). The case body 14 also has a suspension device 32 with the third energy input 34. The suspension device 32 is embodied as a handle means. The suspension device 32 connects the third energy input 34 automatically to an energy output, not shown, for instance of the motor vehicle, when the suspension device 32 of the battery charging case 10 is suspended from a mount of some kind. It is also possible for one of the energy inputs 34, 68, 70, or a further energy input, to be embodied as an electrically contactless energy input.

In addition, when the battery charging case 10 is being stowed in a region intended for the purpose of the motor vehicle, an energy input of the battery charging case 10 could be connected automatically to an energy output of the motor vehicle. For instance, the motor vehicle could have a shelf intended for that purpose.

The supply unit 18 supplies the energy output 16 of the power tool with energy, either from a battery 38 that is discharged for instance by one of the battery chargers 26, 28, 30, or by means of one of the energy inputs 34, 68, 70 of the case body 14.

The electronic unit 40, at an element 72 of a plug connection of the energy output 16, furnishes an adjustable output voltage and, at another element 74 of a plug connection of the energy output 16, it furnishes an alternating voltage, which is embodied as a usual mains voltage (230 V, 50 Hz and/or 110 V, 60 Hz). The adjustable output voltage can be adjusted by a user, not shown, by means of a rotary knob 76. For instance, the adjustable output valve may serve as an aid in starting the motor vehicle. The battery charging case 10 furthermore has two USB interfaces 42, which are supplied with a suitable voltage (5 V) by the electronic unit 40. In addition, other energy outputs, not shown, such as an on-board electrical system outlet (DIN ISO 4165), an electrically contactless energy output, and/or devices, not shown, of the battery charging case 10, such as lamps and/or a radio, could be supplied with energy by the electronic unit 40.

The foregoing relates to a preferred exemplary embodiment of the invention, it being understood that other variants and embodiments thereof are possible within the spirit and scope of the invention, the latter being defined by the appended claims.

We claimed:

1. A rechargeable battery charging case, comprising:
   a case body;
   at least one battery attachment device;
   an electrical energy output; and
   a supply unit, which in at least one operating state is connected to the energy output and to the battery attachment device for supplying the energy output.

2. The rechargeable battery charging case according to claim 1, wherein the battery attachment device has at least one coupling device configured for connecting at least one battery charger of the battery attachment device disconnectably mechanically and disconnectably electrically to the case body.

3. The rechargeable battery charging case according to claim 1, wherein the case body has a suspension device configured for at least one of an energy input and an energy output.

4. The rechargeable battery charging case according to claim 2, wherein the case body has a suspension device configured for at least one of an energy input and an energy output.

5. The rechargeable battery charging case according to claim 1, wherein the case body has at least one BUS system configured for connecting a plurality of units at least electrically.

6. The rechargeable battery charging case according to claim 1, further comprising:

a battery charger configured for charging a rechargeable battery separately from the case body.

7. The rechargeable battery charging case according to claim 2, further comprising:
a battery charger configured for charging a rechargeable battery separately from the case body.

8. The rechargeable battery charging case according to claim 1, further comprising:
a battery charger, which has at least one coupling device configured for charging a battery in electrically contactless fashion.

9. The rechargeable battery charging case according to claim 2, further comprising:
a battery charger, which has at least one coupling device configured for charging a battery in electrically contactless fashion.

10. The rechargeable battery charging case according to claim 1, further comprising:
an electronic unit configured for furnishing an adjustable output voltage.

11. The rechargeable battery charging case according to claim 2, further comprising:
an electronic unit configured for furnishing an adjustable output voltage.

12. The rechargeable battery charging case according to claim 1, further comprising:
an electronic unit configured for furnishing an alternating voltage.

13. The rechargeable battery charging case according to claim 2, further comprising:
an electronic unit configured for furnishing an alternating voltage.

14. The rechargeable battery charging case according to claim 1, further comprising:
at least one USB interface.

15. The rechargeable battery charging case according to claim 2, further comprising:
at least one USB interface.

16. The rechargeable battery charging case according to claim 5, wherein the at least one BUS system has at least two receiving regions for at least one individual, particular unit.

17. A system comprising:
a battery; and
a rechargeable battery charging case according to claim 1.

18. The system according to claim 17, wherein the battery is provided for being charged, while connected to a power tool, by the rechargeable battery charging case.

19. The battery charger of a rechargeable battery charging case according to claim 2.

20. The battery charger of a rechargeable battery charging case according to claim 5.

* * * * *